(12) United States Patent
Ruo Qing et al.

(10) Patent No.: US 7,915,170 B2
(45) Date of Patent: Mar. 29, 2011

(54) REDUCING CONTAMINATION OF SEMICONDUCTOR SUBSTRATES DURING BEOL PROCESSING BY PROVIDING A PROTECTION LAYER AT THE SUBSTRATE EDGE

(75) Inventors: Su Ruo Qing, Dresden (DE); Frank Feustel, Dresden (DE); Carsten Peters, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 845 days.

(21) Appl. No.: 11/625,579

(22) Filed: Jan. 22, 2007

(65) Prior Publication Data

US 2008/0003830 A1 Jan. 3, 2008

(30) Foreign Application Priority Data

Jun. 30, 2006 (DE) .......................... 10 2006 030 266

(51) Int. Cl.
*H01L 21/311* (2006.01)
(52) U.S. Cl. ....................................... 438/694
(58) Field of Classification Search .................. 438/733, 438/694
See application file for complete search history.

(56) References Cited

U.S. PATENT DOCUMENTS

| | | | | |
|---|---|---|---|---|
| 4,179,794 A * | 12/1979 | Kosugi et al. | ................. | 438/465 |
| 5,786,632 A * | 7/1998 | Farnworth et al. | ............ | 257/701 |
| 6,607,983 B1 * | 8/2003 | Chun et al. | .................... | 438/691 |
| 6,656,811 B2 * | 12/2003 | Swanson et al. | .............. | 438/320 |
| 6,713,236 B2 | 3/2004 | Chen | .............................. | 430/313 |
| 6,927,172 B2 | 8/2005 | Bergner et al. | ............... | 438/706 |
| 2001/0051432 A1 * | 12/2001 | Yano et al. | ..................... | 438/690 |
| 2004/0171267 A1 | 9/2004 | Chen et al. | ..................... | 438/694 |
| 2004/0251518 A1 * | 12/2004 | Preusse et al. | ................ | 257/571 |
| 2006/0172525 A1 * | 8/2006 | Werner et al. | ................. | 438/624 |
| 2007/0026670 A1 * | 2/2007 | Schuehrer et al. | ........... | 438/638 |

FOREIGN PATENT DOCUMENTS

| | | | | |
|---|---|---|---|---|
| DE | 102 28 807 A1 | 1/2004 | ...................... | 21/336 |
| DE | 102 58 508 B3 | 9/2004 | ...................... | 21/304 |
| DE | 10 2004 052 644 A1 | 5/2006 | ...................... | 21/308 |
| KR | 1020050060536 | 6/2005 | ........................ | 21/28 |

OTHER PUBLICATIONS

Shamiryan, Abell, Lacopi, and Maex. Low-k Dielectric Materials, Jan. 2004, Materials Today, p. 2.*
Deligoz, Ozgumus, Yalcinyuva, Yildirim, Deger, and Ulutas. A novel cross-linked polyimide film: synthesis and dielectric properties. Apr. 7, 2005, p. 1.*

* cited by examiner

*Primary Examiner* — Nadine G Norton
*Assistant Examiner* — Patti Lin
(74) *Attorney, Agent, or Firm* — Williams, Morgan & Amerson

(57) ABSTRACT

By providing a protection layer at the bevel region, the deposition of polymer materials during the patterning process of complex metallization structures may be reduced. Additionally or alternatively, a surface topography may be provided, for instance in the form of respective recesses, in order to enhance the degree of adhesion of any materials deposited in the bevel region during the manufacturing of complex metallization structures. Advantageously, the provision of the protection layer providing the reduced polymer deposition may be combined with the modified surface topography.

17 Claims, 6 Drawing Sheets

REDUCING CONTAMINATION OF SEMICONDUCTOR SUBSTRATES DURING BEOL PROCESSING BY PROVIDING A PROTECTION LAYER AT THE SUBSTRATE EDGE

BACKGROUND OF THE INVENTION

1. Field of the Invention

Generally, the present disclosure relates to the fabrication of integrated circuits, and, more particularly, to the formation of metallization layers and contaminations related thereto in subsequent processes.

2. Description of the Related Art

Semiconductor devices are typically formed on substantially disc-shaped substrates made of any appropriate material. The majority of semiconductor devices including highly complex electronic circuits are currently, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array form, wherein most of the manufacturing steps, which may add up to 500-1000 or more individual process steps in sophisticated integrated circuits, are performed simultaneously for all chip areas on the substrate, except for photolithography processes, certain metrology processes and packaging of the individual devices after dicing the substrate. Thus, economical constraints drive semiconductor manufacturers to steadily increase the substrate dimensions, thereby also increasing the area available for producing actual semiconductor devices.

In addition to increasing the substrate area, it is also important to optimize the utilization of the substrate area for a given substrate size so as to actually use as much substrate area as possible for semiconductor devices and/or test structures that may be used for process control. In the attempt to maximize the useful surface area for a given substrate size, the peripheral chips are positioned as closely to the substrate perimeter as is compatible with substrate handling processes. Generally, most of the manufacturing processes are performed in an automated manner, wherein the substrate handling is performed at the back side of the substrate and/or the substrate edge, which typically includes a bevel at least at the front side of the substrate.

Due to the ongoing demand for shrinking the feature sizes of highly sophisticated semiconductor devices, copper and alloys thereof, in combination with a low-k dielectric material, have become a frequently used alternative in the formation of so-called metallization layers, which include metal lines and vias connecting individual circuit elements to provide the required functionality of the integrated circuit. Although copper exhibits significant advantages when compared to aluminum being the typical metallization metal for the last decade, semiconductor manufacturers have been somewhat reluctant to introduce copper in the production owing to copper's ability to readily diffuse in silicon and silicon dioxide. Moreover, even when being present in very small amounts, copper may significantly modify the electrical characteristics of silicon and, thus, the behavior of circuit elements, such as transistors and the like. It is, therefore, essential to confine the copper to the metal lines and vias by using appropriate insulating and conductive barrier layers so as to strongly suppress the diffusion of copper into sensitive device regions. Furthermore, any contamination of process tools, such as transport means, transport containers, robot arms, wafer chucks and the like, must be effectively restricted, since even minute amounts of copper deposited on the back side of a substrate may lead to diffusion of the copper into sensitive device areas.

The problem of copper and other device and tool contamination is even exacerbated when low-k dielectric materials are employed in combination with copper to form metallization layers, owing to the reduced mechanical stability of the low-k dielectrics. Since at least some of the deposition processes used in fabricating semiconductors may not be efficiently restricted to the "active" substrate area, a stack of layers or material residues may also be formed at the substrate edge region including the bevel, thereby generating a mechanically unstable layer stack owing to process non-uniformities at the substrate edge and especially at the bevel of the substrate. In particular, low-k dielectrics formed by chemical vapor deposition (CVD) tend to adhere more intensively at the bevel edge region compared to the active substrate region, thereby building up an increased layer thickness that may be up to twice the thickness of the dielectric material in the active region. Thus, during the formation of a plurality of metallization layers, a layer stack at the bevel region may be formed that includes barrier material, copper and dielectrics, which exhibit a reduced adhesion to each other. During the further production and substrate handling processes, material such as copper, barrier material and/or the dielectrics may delaminate and significantly affect these processes, thereby negatively affecting production yield and tool integrity.

For instance, in forming a copper-based metallization layer, the so-called inlaid or damascene technique is presently a preferred manufacturing method to create metal lines and vias. To this end, a dielectric layer, typically comprised of a low-k dielectric, is deposited and patterned to include trenches and vias in accordance with design requirements. During the patterning process, polymer materials, which may be used for adjusting the etch characteristics of the patterning process, may be deposited on substrate areas of highly non-uniform process conditions, such as the substrate edge, the bevel and the adjacent back side area. The polymer materials, which include fluorine, may additionally contribute to modified adhesion properties for any other material that may be deposited in subsequent processes, thereby contributing to an increased tendency for causing delamination events. Therefore, in some approaches, a respective wet chemical clean process may be performed in an attempt to remove the polymer residuals. Thereafter, a conductive barrier layer comprised of, for example, tantalum, tantalum nitride, titanium, titanium nitride and the like, may be deposited, wherein the composition of the barrier layer is selected so as to also improve the adhesion of the copper to the neighboring dielectric. The deposition of the barrier layer may be accomplished by CVD or physical vapor deposition (PVD), wherein a deposition of the barrier material may not be efficiently restricted to the active substrate area by presently established deposition techniques. Consequently, the barrier material may also be deposited at the substrate bevel and partially at the back side of the substrate, thereby forming, in combination with residues of the dielectric material that may not be efficiently removed by the previous etch processes for patterning the dielectric layer, a layer stack of reduced mechanical stability, wherein any polymer residuals that may have not been removed efficiently due to a limited efficiency of the previous wet clean process may additionally reduce the mechanical stability. Thereafter, according to a standard damascene process flow, a thin copper seed layer is deposited by PVD or similar appropriate processes to initiate and promote a subsequent electrochemical deposition process to fill the trenches and vias formed in the dielectric material.

Although reactor vessels for the electrochemical deposition, such as electroplating reactors or electroless plating reactors, may be designed such that substantially no copper is deposited at the substrate edge, the preceding seed layer deposition process may nevertheless result in a significant deposition of unwanted copper at the substrate edge region. After the electrochemical deposition of the bulk copper, any excess material has to be removed. This is frequently achieved by chemical mechanical polishing (CMP), wherein material fragments, such as copper pieces, may "flake off" owing to the reduced stability of the metallization layer stack, especially at the substrate bevel. The copper-containing material flakes and other material flakes comprised of dielectric material and/or barrier material, for instance liberated during the CMP process, may then re-deposit at unwanted substrate regions or may affect the CMP process of subsequent substrates. During the further processing of the substrate, a contamination, mainly caused by the delamination at the substrate edge, may occur and may especially adversely affect the so-called back end process flow, in which contact pads and solder bumps are formed.

Since contamination caused by, for instance, unwanted copper at the substrate edge has been identified as a major contamination source, great efforts are being made to remove copper from the substrate edge and the bevel substantially without affecting the inner, i.e., the active, substrate region. To this end, etch modules have been developed by semiconductor equipment providers, such as Semitool Inc., Novellus Inc. and the like, which are configured to selectively provide an agent substantially comprised of sulfuric acid and hydrogen peroxide to the substrate edge so as to remove unwanted copper from this region. Although the removal of unwanted copper from the substrate edge reduces the risk of copper contamination of subsequent processes, it turns out, however, that a significant reduction of production yield, especially in the manufacturing sequence for higher metallization layers and in the back end process flow, is still observable.

The present disclosure is directed to various methods that may solve, or at least reduce, some or all of the aforementioned problems.

SUMMARY OF THE INVENTION

The following presents a simplified summary of the disclosed subject matter in order to provide a basic understanding of some aspects of the subject matter disclosed herein. This summary is not an exhaustive overview of the technology disclosed herein. It is not intended to identify key or critical elements of the invention or to delineate the scope of the invention. Its sole purpose is to present some concepts in a simplified form as a prelude to the more detailed description that is discussed later.

Generally, the present disclosure is directed to a technique that enables a significant reduction of yield loss during the formation of metallization layers of semiconductor devices, which, in some illustrative embodiments, represent semiconductor devices including highly conductive metals, such as copper, copper alloys and the like, embedded in a low-k dielectric material. For this purpose, the probability for material delamination or "flaking" during the patterning of metallization layers may be significantly reduced by appropriately modifying the characteristics of a bevel region of the substrate with respect to the adhesion of polymer materials and other material residues that may be deposited above the bevel region, thereby creating a potential risk for material delamination in subsequent process steps. According to one aspect, the adhesion characteristics with respect to polymer materials encountered during anisotropic etch processes for patterning the dielectric layer stack may be adjusted such that a reduced probability for the adhesion of the polymer material may be achieved. In accordance with other aspects, the overall adhesion of any material residues may be enhanced, for instance by increasing the surface area of the bevel region, in order to provide an overall increased mechanical stability of etch residues created during the patterning of subsequent metallization layers. In some aspects, an increased surface area, provided by a correspondingly adapted surface topography in the bevel region, may be advantageously combined with an effective modification with respect to polymer adhesion, thereby even more effectively reducing the probability for material delamination during the process flow for manufacturing metallization structures.

According to one illustrative embodiment disclosed herein, a method comprises selectively forming a protection layer above a portion of a surface of a bevel region of a substrate, which comprises a central region adjacent to the bevel region for receiving circuit elements thereon. The protection layer has a surface exhibiting a different adhesion characteristic with respect to etch-related polymer materials compared to the surface area of the bevel region. Moreover, the method comprises forming a dielectric layer stack for a metallization layer above the substrate and patterning the dielectric layer stack by an anisotropic etch process.

According to another illustrative embodiment disclosed herein, a method comprises forming a dielectric layer stack for a metallization layer of a semiconductor device above a substrate, wherein the substrate comprises a central region adjacent to a bevel region. The bevel region has a surface topography for providing an increased surface area. Moreover, the dielectric layer stack is patterned on the basis of an anisotropic etch process.

In accordance with yet another illustrative embodiment disclosed herein, a method comprises selectively forming a protection layer above a bevel region of a substrate, wherein the bevel region comprises a plurality of recesses. Moreover, the method comprises, after selectively forming the protection layer, the patterning of a dielectric layer stack formed in a central region of the substrate, wherein the central region comprises a plurality of circuit elements of an integrated circuit.

BRIEF DESCRIPTION OF THE DRAWINGS

The disclosure may be understood by reference to the following description taken in conjunction with the accompanying drawings, in which like reference numerals identify like elements, and in which.

Figure 1A:
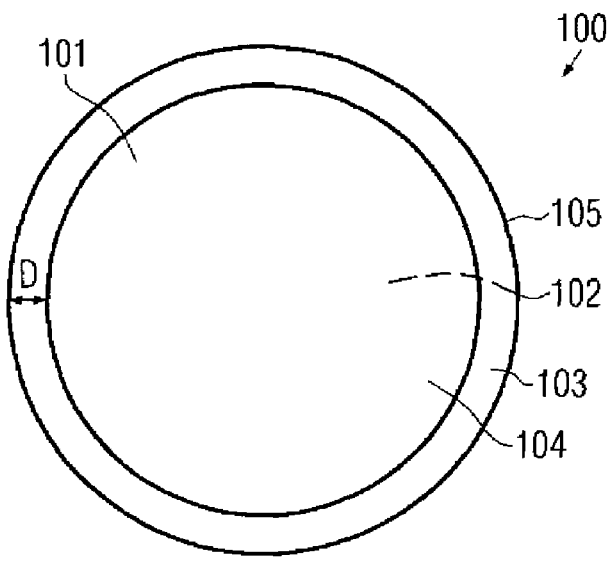
FIG. 1a schematically illustrates a top view of a substrate including an "active" or central region located adjacent to a bevel region.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the subject matter disclosed herein. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure is directed to a technique that enables the formation of circuit elements within a central region of a substrate with a significantly reduced probability of device and tool contamination, in particular when the respective semiconductor devices comprise a complex metallization structure including one or more metallization layers on the basis of a low-k dielectric material. It is believed that the formation of mechanically unstable layer stacks on the bevel of the substrate may contribute significantly to the overall contamination and defect rate during the formation of critical metallization layers, thereby significantly affecting the production yield. For example, the presence of polymer materials at the bevel which may deposit during the patterning process for forming respective via openings and trenches in the dielectric material may contribute to an overall increased probability for material delamination in subsequent manufacturing steps. Respective polymer materials may be required in order to appropriately adjust the etch characteristics of the sophisticated anisotropic etch processes used for forming high aspect ratio openings in low-k dielectric materials. Since polymer materials may per se have a moderate affinity for adhering to a plurality of normally used materials, such as inorganic dielectrics and the like, the presence of such polymer materials may therefore significantly reduce the overall stability and thus contribute to a significant risk for material delamination. Consequently, in conventional approaches, frequently an appropriately designed wet chemical or dry etch process may be performed at the bevel region in order to remove the polymer residues accumulated in the bevel region during the preceding etch process for patterning the low-k dielectric material. However, respective wet chemical etch processes may require a high amount of respective chemicals, which cause significant costs for obtaining and disposing chemicals, while an efficient removal of the polymer materials within the entire bevel region may nevertheless be difficult. On the other hand, plasma-based etch processes may create an increased probability for depositing particles within the central region of the substrate, thereby making this approach for removing polymer materials from the bevel region less attractive. By appropriately modifying the surface area of the bevel region so as to create different characteristics with respect to polymer adhesion to other dielectric and metallic materials, which may be accomplished in some aspects by selectively providing a protection layer endowing the bevel region with modified polymer adhesion characteristics and by providing an appropriate surface topography in the bevel region, the deposition of polymer materials may be significantly reduced and/or any polymer material deposited may be "encapsulated" by other materials having an increased adhesion due to the modified surface topography. Consequently, the risk for the "flaking" off of dielectric and metallic material during the further processing of the substrate may be significantly reduced.

It should be appreciated that the subject matter disclosed herein is particularly advantageous in the context of metallization layers including copper and copper alloys in combination with low-k dielectric materials since, as previously explained, during the deposition of the low-k dielectric materials which may per se exhibit a reduced mechanical stability and adhesion compared to conventional dielectric materials, such as silicon dioxide, silicon nitride and the like, a non-uniform layer thickness, for instance an increased layer thickness, may be created on the bevel region, thereby enhancing even more the risk of material delamination during subsequent substrate handling and manufacturing processes. The subject matter disclosed herein may, however, also be applied in combination with other manufacturing and metallization schemes, since the selective modification of adhesion characteristics may be performed at any appropriate manufacturing state, thereby improving production yield due to a significant reduction of particles created by substrate handling processes, CMP processes and the like. Thus, unless otherwise explicitly specified in the description or the appended claims, the present invention should not be restricted to a specific material composition of the dielectric materials and the conductive materials used for the formation of metallization layers.

FIG. 1a schematically depicts a substrate 100 having a front side 101, on which circuit elements such as transistors and the like may be formed, and having a back side 102, which is frequently in contact with any type of substrate holders during the transport and processing of the substrate 100. The front side 101 of the substrate 100 may be divided into an "active" or central region 104, within which the plurality of individual chips are to be arranged, and into an edge or bevel region 103, which may not be used for the fabrication of circuit elements due to process non-uniformities, substrate handling requirements and the like, wherein particularly deposition non-uniformities may occur in the vicinity of the substrate perimeter, i.e., the bevel region 103, which may typically include a bevel 105. The size of the bevel region 103 and thus of the central region 104 depends on the controllability of the processes involved in manufacturing circuit elements in and on the central region 104, the capability of transport means used for supporting and transporting the substrate 100 between subsequent processes and the like. Desirably, the size of the bevel region 103 may be kept as small as possible to preserve as much substrate area as possible for the formation of integrated semiconductor chips in the central region 104. Presently, 200 mm and 300 mm are typical diameters of substrates used in modern semiconductor facilities, wherein a width D of the bevel region 103 may range from approximately 1-5 mm.

Figure 1B:
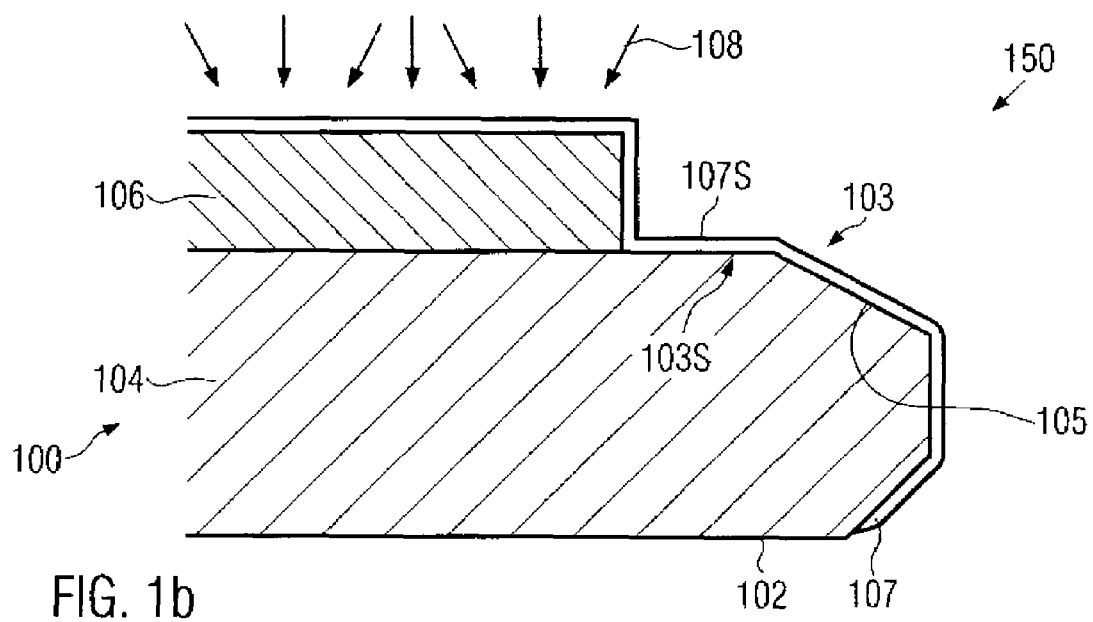
FIGS. 1b-1f schematically illustrate cross-sectional views of a semiconductor device during various manufacturing stages in forming a metallization layer wherein a protection layer may be selectively provided at a bevel region for reducing the probability of polymer deposition during the patterning process.

FIG. 1b schematically illustrates a cross-sectional view of a semiconductor device 150 comprising a portion of the substrate 100, wherein a bevel region 103 comprises the bevel 105. It should be appreciated that, in some illustrative embodiments, in this manufacturing stage, the substrate 100 may have formed therein and thereon a plurality of circuit elements that are located in the central region 104 wherein, for convenience, any such circuit elements are not shown. In other illustrative embodiments, the device 150 may not, in this manufacturing stage, have formed therein any circuit elements in the central region 104. In one illustrative embodiment, a mask layer 106 may be formed so as to substantially cover the central region 104, while substantially exposing the bevel region 103. For instance, the mask layer 106 may be formed of any appropriate material, such as photoresist, polymer material and the like, which may be readily removed by appropriate techniques, including moderately high temperatures and the like. Furthermore, a protection layer 107 may be formed on the mask layer 106 and on or above exposed surface portions 103S of the bevel region 103, wherein the protection layer 107 may be comprised of an appropriate material so as to exhibit different characteristics with respect to adhesion of a fluorine-containing polymer material as is typically used or generated during an anisotropic etch process for patterning dielectric materials of metallization structures, as will be described later on in more detail. That is, typically the surface area 103S of the bevel region 103 may be comprised of materials typically used for the formation of semiconductor devices, such as silicon, silicon dioxide, silicon nitride and the like. Thus, depending on the process strategy and history of the semiconductor device 150, the surface region 103S may typically be comprised of inorganic material with a substantially planar surface topography, which is to be understood to include a roughness of less than about approximately 1 µm. The protection layer 107, however, may have different surface characteristics with respect to an interaction with polymer materials, wherein, in one illustrative embodiment, the respective surface area 107S may induce a lower adhesion to etch-related polymers, as specified above, compared to the surface area 103S. It should be appreciated that a corresponding measure for the adhesion of one material on another one may be readily determined on the basis of measurement, in which a force per area unit may be determined, which is required to remove a respective defined surface area on a material formed on an underlying material, or any other parameter may be used that allows quantifying the difference in adhesion.

For example, a layer of polymer material under consideration may be formed on a material layer, such as a test substrate and the like, and a corresponding force, such as a shear force, for removing the respective polymer layer may be determined. Similarly, the protection layer 107 may be formed on an appropriate carrier material and polymer material may be deposited thereon, and subsequently the respective force for removing a portion of the polymer material may be determined and compared with the previous measurement results. In other cases, the surface characteristics with respect to the adhesion of polymer material may be estimated on the basis of optical inspection techniques and the like, wherein the amount of polymer material may be estimated when a corresponding substrate with and without the protection layer 107 is exposed to specified conditions, such as a specified etch ambient and the like. Consequently, different adhesion characteristics with respect to etch-related polymer materials may be understood as a difference in appropriate parameter, such as the force required for removing the respective polymer material from the surface area 107S compared to the surface area 103S, or as the difference in the amount of polymer material deposited on a surface equivalent to the surface 107S relative to a surface equivalent to the surface area 103S without the protection layer. In some illustrative embodiments, the respective surface areas 107S, 103S may be considered as different with respect to their adhesion characteristics for an etch-related polymer material when the respective test results for any of the above-described test procedures provides a numerical difference of at least 30% between a surface representing the protection layer 107 and a surface representing the non-protected surface 103S. That is, when a respective measurement value obtained for a surface equivalent to the surface 107S is approximately 30% less than the value obtained for a surface equivalent to the surface area 103S, the respective protection layer 107 has a reduced adhesion characteristic compared to the surface 103S of the bevel region 103 in the above sense. Similarly, if a corresponding measurement value for a surface equivalent to the surface 107S is approximately 1.3 or higher times the corresponding measurement result for a surface equivalent to the non-protected surface area 103S, the corresponding adhesion characteristic for the polymer material of the protection layer 107 is higher compared to the bevel region 103.

In one illustrative embodiment, the protection layer 107 may be comprised of a polymer material which exhibits reduced adhesion characteristics in the above-defined sense with respect to etch-related fluorine modified polymer materials. Moreover, the protection layer 107 may also exhibit a certain amount of etch resistance with respect to an etch recipe to be performed in a later manufacturing stage for patterning a corresponding dielectric layer stack. A thickness of the protection layer 107 may, depending on the overall material characteristics, be selected in a range of approximately 10-100 nm.

A typical process flow for forming the semiconductor device 150 as shown in FIG. 1b may comprise the following processes. After the formation of any circuit elements within the device region 104 on the basis of well-established recipes, the mask layer 106 may be formed on the basis of any appropriate deposition technique, such as chemical vapor deposition (CVD), spin-on techniques and the like. It should be appreciated that, depending on the deposition technique used, a certain amount of the material of the layer 106 may also be deposited within the bevel region 103. In this case, an appropriately designed patterning process, for instance a selective curing of polymer material, a selective exposure with appropriate radiation and the like, may be performed in order to appropriately modify the characteristics of the mask layer 106 within the central region 104 to allow efficient removal of any material residues within the bevel region 103. Thereafter, the protection layer 107 may be deposited on the basis of any appropriate technique, such as CVD, wherein the respective process conditions are appropriately selected in order to not unduly damage the mask layer 106. For instance, a process temperature may be maintained below a critical temperature at which the thermal stability of the mask layer 106 may significantly decrease. Next, the semiconductor device 150 is subjected to a removal process 108, which may comprise an appropriate treatment, such as a heat treatment above a critical temperature and the like, in order to commonly remove the mask layer 106 and the respective portion of the protection layer 107 formed thereon. The removal process 108 may also comprise any clean processes to efficiently remove any material residues from the mask layer 106 and the protection layer 107 within the central region 104.

Figure 1C:
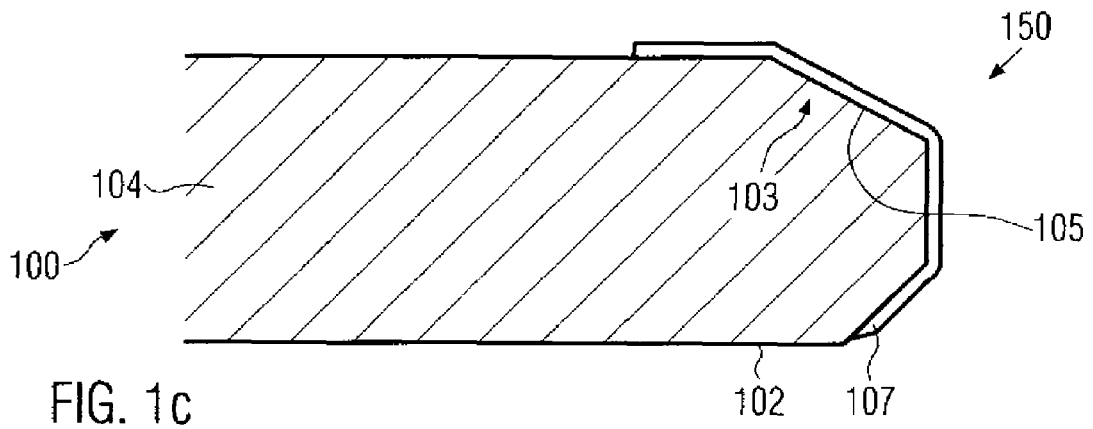

FIG. 1c schematically illustrates the semiconductor device 150 after the removal process 108. Hence, the semiconductor device 150 comprises the remaining portion of the protection layer 107, which is also indicated as 107, formed above the bevel region 103, thereby endowing the bevel region 103 with a different adhesion characteristic with respect to the adhesion of polymer materials during a subsequent patterning process.

Figure 1D:
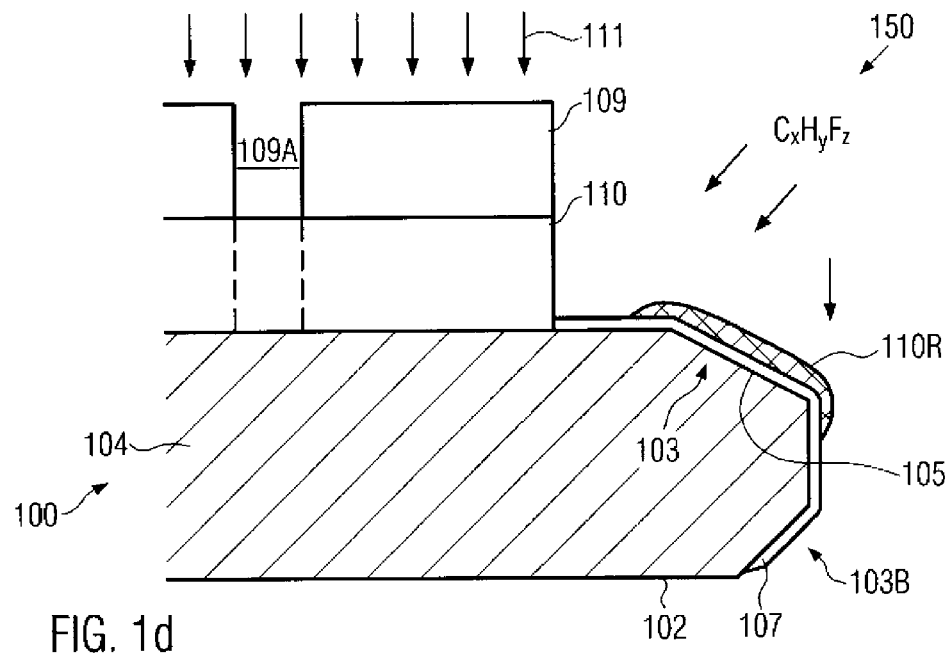

FIG. 1d schematically illustrates the semiconductor device 150 in a further advanced manufacturing stage. The semiconductor device 150 may comprise a dielectric layer stack 110, which is substantially formed within the central region 104, wherein certain material residues 110R may also be formed within the bevel region 103. The dielectric layer stack 110 may comprise one or more material layers, wherein, in some illustrative embodiments, a low-k dielectric may be provided within the layer stack 110. It should be appreciated that a low-k dielectric material is to be considered as a dielectric material having a relative permittivity of 3.0 and significantly less, such as 2.5 and less. The corresponding low-k dielectric material may be provided in the form of a sub-layer in the stack 110 or may be provided substantially throughout the entire stack 110, except for any etch stop layers or capping layers that may be required for controlling respective etch processes and/or reliably confining a metal and/or for increasing the mechanical stability of the layer stack 110. Moreover, a mask 109, such as a resist mask, may be formed above the layer stack 110 and may be appropriately patterned to include a plurality of openings 109A in order to form respective openings within the dielectric layer stack 110.

The dielectric layer stack 110 may be formed on the basis of well-established deposition techniques, for instance CVD, spin-on techniques and the like. Thereafter, an appropriate masking material is provided, such as a resist material, including any appropriate anti-reflective coating (ARC) layers when an optical lithography process is used for forming the opening 109A on the basis of well-established lithography techniques. In other examples, the mask layer 109 may represent any other appropriate mask material that may have been patterned on the basis of optical lithography, imprint techniques and the like. For instance, the layer 109 may represent a moldable material, into which an appropriately designed imprint mold or die may be imprinted in a highly deformable state of the material layer 109. Subsequently, the material 109 may be brought into a highly non-deformable state for removing the corresponding imprint die in order to form the opening 109A. Irrespective of the technique for providing the mask layer 109, a corresponding anisotropic etch process 111 may be subsequently performed to transfer the opening 109A into the dielectric layer stack 110. During the anisotropic etch process 111, the corresponding etch characteristics, such as the degree of isotropy and the like, may depend significantly on the respective gas ambient and the plasma conditions. For instance, gases such as argon, nitrogen, oxygen and fluorine, in combination with carbon/hydrogen compounds, i.e., polymers, may be used, wherein the amount of polymers may, in combination with specified plasma parameters, such as bias voltage, pressure and the like, determine the directionality of the etch front of the process 111. For instance, in highly complex semiconductor devices, the respective openings to be formed in the dielectric layer stack 110 may require a high aspect ratio, thereby also imposing respective constraints with respect to the anisotropic behavior of the etch process 111. Consequently, increased amounts of polymer materials may be required, wherein the adhesion of the polymer material at horizontal portions of the mask layer 109 and the dielectric layer stack 110 may be significantly suppressed by the continuous ion bombardment, while, on the other hand, the respective polymer material may come into contact with exposed portions of the bevel region 103, wherein a significantly reduced ion bombardment may allow, in conventional cases, without providing the protection layer 107, a moderate deposition of fluorine-containing polymers, although in principle the adhesion of such polymer materials to inorganic dielectrics is relatively low.

According to the embodiment shown in FIG. 1d, during the ongoing etch process 111, the stack 110 may be etched, while residues may also be increasingly removed. Due to the modified adhesion characteristics of the protection layer 107, which, in some embodiments, may also have an increased etch resistance compared to the material of the layer 110, the adhesion of any polymer material may be significantly reduced compared to a situation in which the bevel region 103 would not be covered by the protection layer 107. For instance, as previously explained, polyimide material may have a significantly reduced tendency for forming respective bonds with fluorine-containing polymer materials, thereby also reducing the amount of accumulated polymer material in the bevel region 103. In particular, at areas in the vicinity of the backside of the substrate 100, indicated as 103B, in conventional techniques, a moderately high amount of polymer materials may be observed, even after a corresponding wet clean process, while, in the embodiment shown, a significantly reduced polymer accumulation may be accomplished. Therefore, in some illustrative embodiments, after the etch process 111, which may optionally include an in situ resist strip process when the mask layer is provided in the form of a resist mask, a corresponding additional selective wet clean process for the bevel region 103 may be omitted and the process sequence may advance to the deposition of an appropriate conductive material. In this case, a significant savings in expensive chemicals may be achieved, in particular when substrates with large diameters, such as 300 mm substrates, are considered, since here a significant amount of chemicals may be required for respectively cleaning the bevel region 103, compared to a 200 mm substrate having a similar width D of the bevel region 103. In other illustrative embodiments, a respective wet clean process may be performed on the basis of a reduced process time and less efficient, less expensive chemicals since the deposition of polymers may have been significantly reduced due to the provision of the protection layer 107.

Figure 1E:
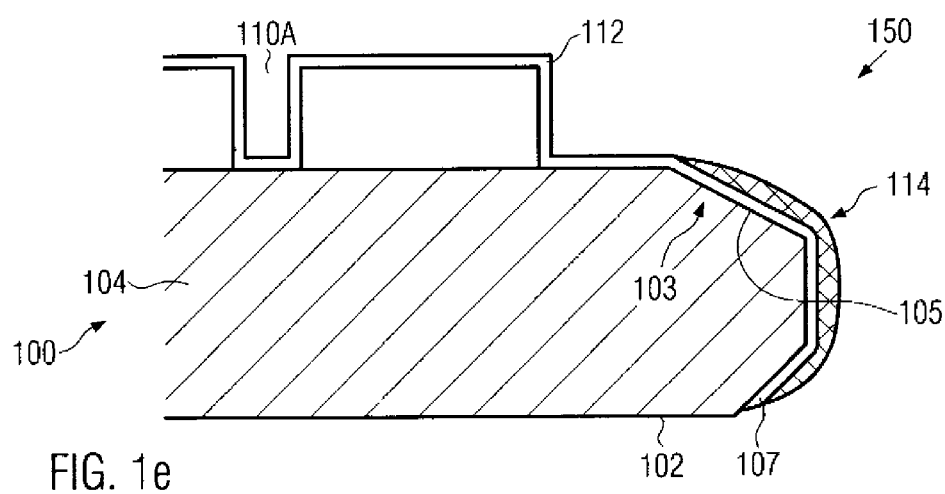

FIG. 1e schematically illustrates the semiconductor device 150 with a conductive layer 112 formed within a respective opening 110A formed in the dielectric layer stack 110, wherein, as previously explained, the deposition of the conductive layer 112 may not be effectively restricted to the central region 104, and hence the corresponding layer 112 may also be formed within the bevel region 103. For example, the conductive layer 112 may comprise an appropriate barrier material and, if required, an appropriate seed material in order to facilitate the subsequent electrochemical deposition of a highly conductive metal, such as copper, copper alloy, silver, silver alloy and the like. The conductive layer 112 may be formed on the basis of any appropriate deposition technique, such as sputter deposition, CVD, atomic layer deposition (ALD), electroless plating, any combinations thereof and the like. It should be appreciated that, even though the layer 112 is also formed in the unwanted bevel region 103, the significantly reduced amount of polymer material results in a moderately high adhesion of the barrier material 112, thereby contributing to a reduced probability for material delamination in subsequent process steps. In other illustrative embodiments, as will be described later on in more detail, the protection layer 107 may be removed on the basis of a spatially restricted etch process, when the characteristics of the protection layer 107 are considered inappropriate for forming thereon further material layers, such as the layer 112. After the deposition of the layer 112, the bulk material for forming a respective metal region in the opening 110A may be deposited on the basis of electro-chemical deposition techniques, such as electroless plating, electroplating or any combination thereof. Next, any excess material of the layer 112 and the bulk material may be removed on the basis of electropolishing, CMP and the like, wherein the increased adhesion of material deposited in the bevel region 103, due to the reduced amount of polymer material, may therefore significantly reduce material delamination and thus substrate and tool contamination.

Figure 1F:
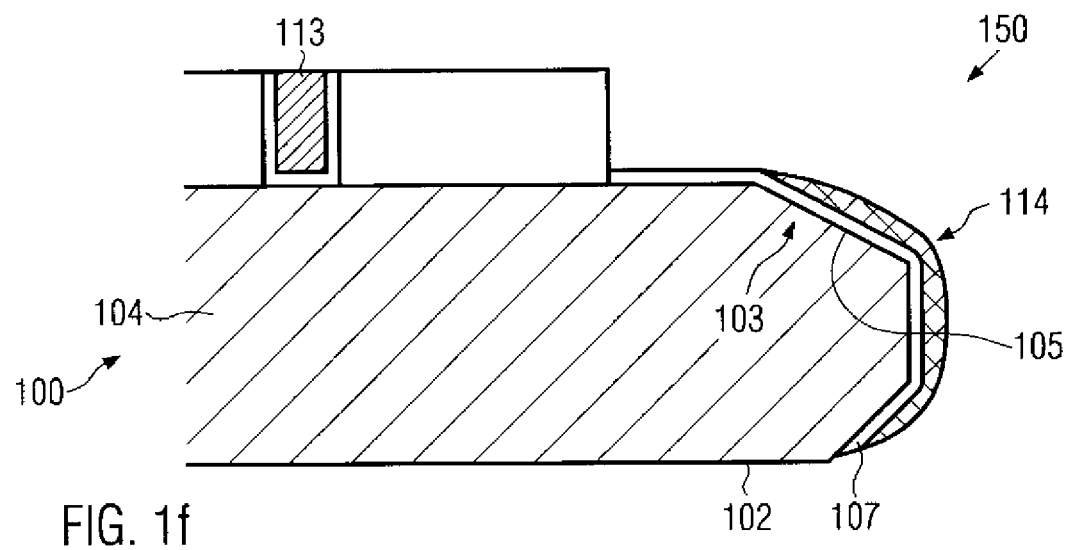

FIG. 1f schematically illustrates the semiconductor device 150 after the completion of the above-described process sequence. Hence, a metal region 113 may be formed within the opening 110A. Moreover, a moderately stable stack of materials 114 may be formed in the bevel region 103 with a reduced probability for delamination during the preceding and subsequent process steps. In some illustrative embodiments, the material stack 114 may be selectively removed by any appropriate etch techniques to expose the protection layer 107, depending on the etch selectivity of the material of the layer 107 and the metal material deposited during the formation of the layers 112 and the metal region 113, or to expose the bevel region 103. In one illustrative embodiment, the protection layer 107 may be provided such that it exhibits a high etch resistance with respect to the etch chemistry used during the removal of unwanted material from the bevel region 103. For example, the protection layer 107 may comprise silicon carbide, which exhibits a high etch resistance with respect to a plurality of wet chemical etch processes, thereby serving as an efficient etch stop layer for any wet chemical etch processes for removing unwanted metallic and dielectric materials from the bevel region 103. Additionally, a respective surface layer (not shown) may be provided in combination with the silicon carbide material in order to endow the protection layer 107 with the desired adhesion characteristics with respect to the polymer material. Thus, the respective material, such as polyimide, may provide the reduced polymer deposition during the etch process 111, while the silicon carbide material may provide a reliable etch stop and the respective surface material having desired adhesion characteristics may be increasingly consumed by subsequent process steps. Consequently, any unwanted material may be efficiently removed from the bevel region 103 on the basis of the etch stop characteristics and, thereafter, if the adhesion reducing surface may have been consumed, a further protection surface layer which may, however, not need to include an etch stop material may be formed on the silicon carbide material, providing enhanced polymer rejection characteristics during the formation of a subsequent metallization layer.

With reference to FIGS. 1g-1j, further illustrative embodiments will now be described in more detail, in which the semiconductor device 150 receives the protection layer 107 in a selective fashion on the basis of respective mask layers formed after the deposition of the protection layer 107.

Figure 1G:
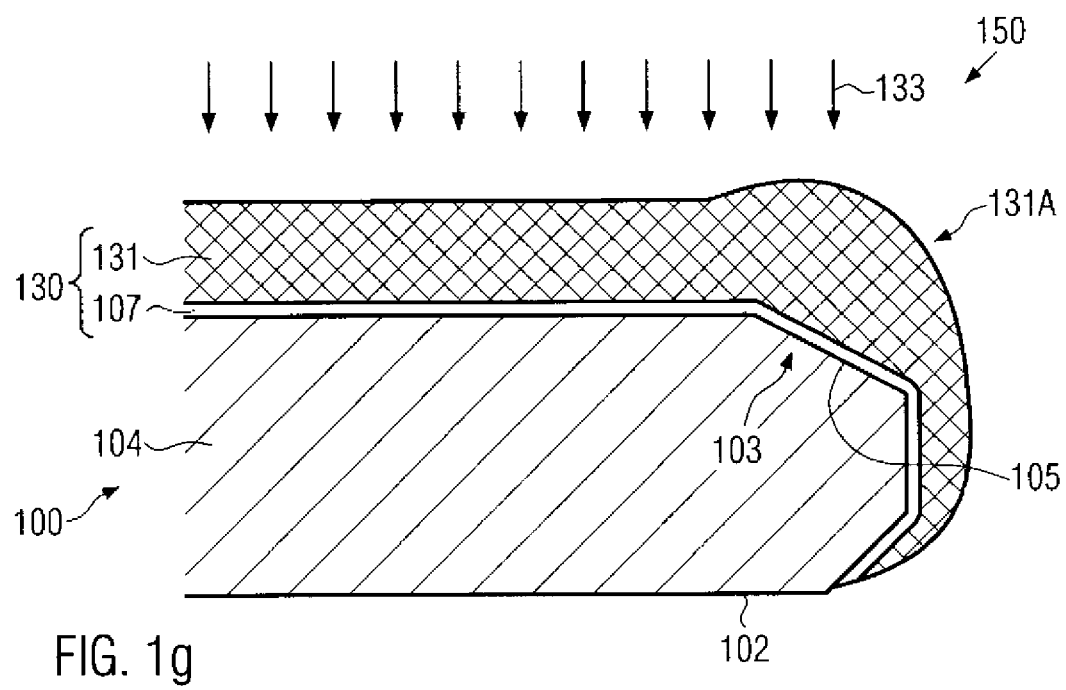
FIGS. 1g-1k schematically illustrate cross-sectional views of a semiconductor device during the formation of a protection layer selectively at a bevel region.

FIG. 1g schematically illustrates the device 150 having formed thereon a layer stack 130 comprising the protection layer 107 and a mask layer 131. In one illustrative embodiment, the mask layer 131 may be comprised of a low-k dielectric material having the property to exhibit a highly non-uniform deposition behavior with respect to the central region 104 and the bevel region 103, when applied by CVD techniques. In one embodiment, the mask layer 131 may comprise a material including silicon, carbon, oxygen and hydrogen, referred to as SiCOH, the deposition of which may result in an increased thickness 131A in the bevel region 103, while, in other embodiments, the portion 131A may have, in addition or alternatively to the increased thickness, a modified structure compared to the central region 104, wherein the modified structure in the portion 131A may result in a reduced etch rate with respect to a specified etch recipe.

The deposition of the protection layer 107 may be performed on the basis of well-established plasma enhanced CVD techniques, wherein usually material is also deposited in the bevel region 103. Thereafter, the mask layer 131 may be deposited by any appropriate deposition technique, wherein it turns out that, in particular during the plasma-based deposition of low-k dielectric materials, an increased deposition rate may be obtained at the bevel region 103, thereby automatically creating the portion 131A of increased layer thickness compared to the thickness of the layer 131 in the central region 104. After the deposition of the mask layer 131, an etch process 133 may be performed to remove the mask layer 131 in the central region 104, while maintaining a significant amount of the portion 131A above the bevel region 103. The etch process 133 may be designed as any appropriate process, such as a wet chemical process or a dry etch process, having a high selectivity between the protection layer 107 and the mask layer 131.

Figure 1H:
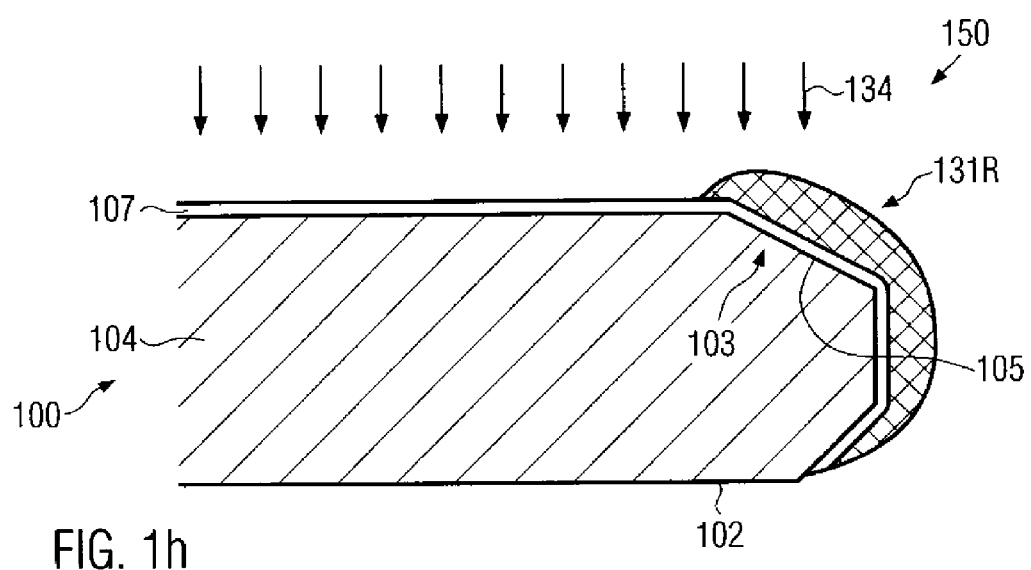

FIG. 1h schematically illustrates the semiconductor device 150 after the end of the above-described etch process 133. Hence, a residue 131R of the mask layer 131 may be formed within the bevel region 103. Consequently, the residue 131R may act as an etch mask in a subsequent etch process 134 for removing the protection layer 107 from the central region 104. The etch process 134 may be selected according to the characteristics of the material of the residue 131R and the protection layer 107 in order to remove the central portion while reliably maintaining at least a portion of the protection layer 107 within the bevel region 103. For example, if the protection layer 107 may comprise silicon carbide, which may be supplemented by an appropriate surface material, such as polyimide and the like, efficient anisotropic etch recipes are well-established in the art, wherein process parameters may be adjusted such that the removal of the exposed portion of the protection layer 107 above the central region 104 is completed prior to causing a significant material erosion of the layer 107 above the bevel region 103.

Figure 1I:
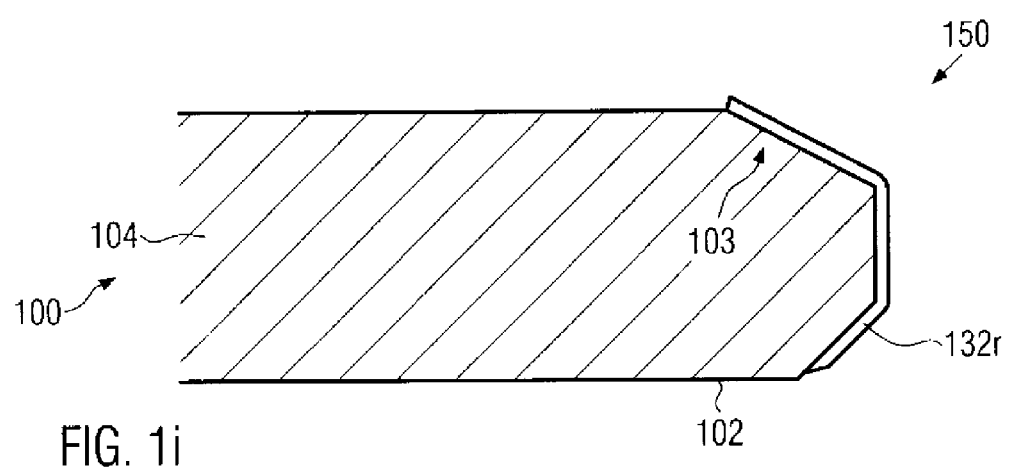

FIG. 1i schematically illustrates the device 150 after the completion of the above-described etch process 134. Hence, the bevel region 103 is covered by the protection layer 107 in order to impart the required adhesion characteristics to the bevel region 103, as is previously explained.

Figure 1J:
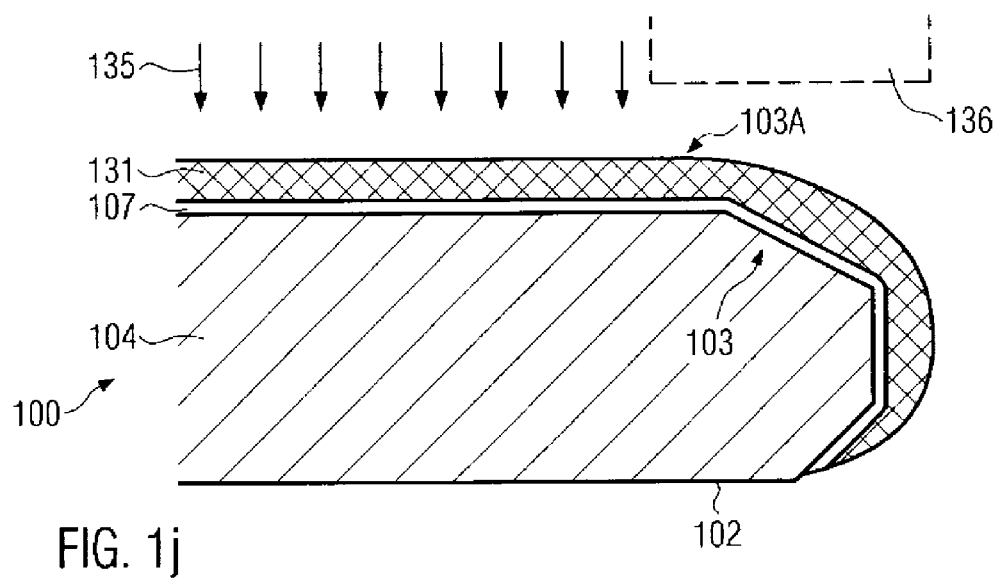

FIG. 1*j* schematically illustrates the semiconductor device 150 in accordance with further embodiments, in which additionally or alternatively the mask layer 131 is treated in such a manner that its etch rate is increased in the central region 104 relative to the bevel region 103. In the embodiment shown, the mask layer 131 is subjected to an ion implantation process 135 on the basis of an appropriate ion species, such as xenon and the like, so as to significantly alter the intrinsic structure of the mask layer 131. In one embodiment, the substantially "self-aligned" nature of the implantation process 135 may alter the mask layer 131 in horizontal substrate portions more effectively than in tilted substrate portions, such as within the bevel region 103, since here the averaged thickness of the mask layer 131 "seen" by the arriving ions is increased compared to the horizontal substrate portions. Consequently, a damaged portion of the layer structure may extend substantially down to the protection layer 107 within the central region 104, while a significant portion of the mask layer 131 may exhibit a substantially non-damaged structure. Consequently, in a subsequent etch process such as the process 133 previously described, removal of material may occur more rapidly in the central region 104, at least when the etch front reaches the substantially non-damaged portion in the bevel region 103. Consequently, the respective residue 131R may be efficiently formed in the bevel region 103 and the further processing may be continued as is previously described with reference to FIG. 1*h*. In another illustrative embodiment, the spatial selectivity of the ion implantation process 135 may be enhanced by substantially restricting the ion bombardment of the implantation 135 to the central region 104, which may be accomplished by correspondingly controlling the scan process and/or by providing a respective shadowing mask 136 that is appropriately positioned to significantly reduce the number of ions arriving at the bevel region 103.

Figure 1K:
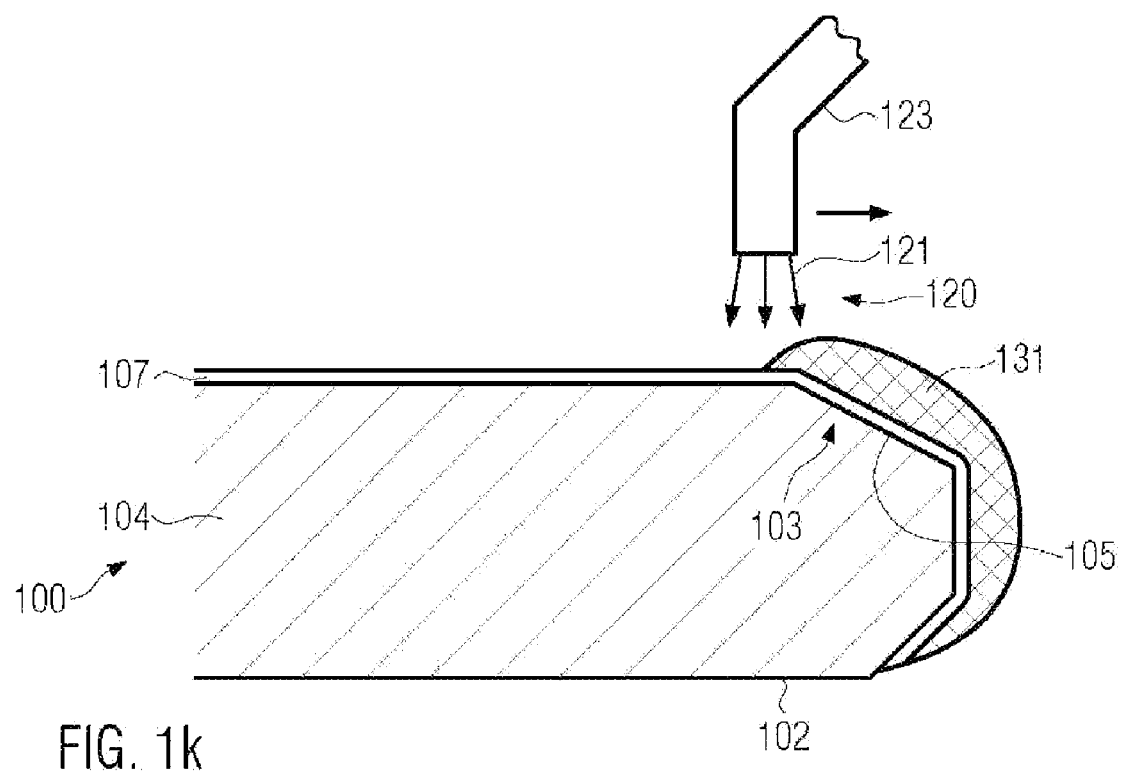

FIG. 1*k* schematically illustrates the device 150 according to another illustrative embodiment, in which the mask layer 131 or the protection layer 107 may be selectively formed in the bevel region 103 by selectively supplying a viscous material, such as photoresist, polymer materials and the like, by means of an appropriate process tool, as it may also be used for the spatially selective cleaning or etching of the bevel region 103. That is, when the protection layer 107 may have appropriate material characteristics so as to allow the deposition by spin coating, for instance by a respective instrument 120 having an appropriate output nozzle 123, a highly efficient technique may be provided. In other cases, when the protection layer 107 is formed on the basis of spatially non-selective deposition techniques, the mask layer 131 may be formed within the bevel region by spin coating and subsequently the protection layer 107 may be patterned as is described above.

Thereafter, the further processing may be continued as is previously described with reference to FIGS. 1*d*-1*f* in order to form the respective metallization structure comprised of the dielectric layer stack 110 and the metal region 113. As previously indicated, any unwanted material may then be selectively removed on the basis of the instrument 120 in order to supply an appropriate etch chemical, wherein the protection layer 107 may include a corresponding etch stop material for substantially avoiding any undue damage of the substrate 100. Consequently, a highly efficient technique is obtained in which the probability of material delamination during the formation of complex metallization structures may be significantly reduced by suppressing the degree of polymer adhesion and thus accumulation during the process of patterning dielectric materials, such as low-k dielectric materials, thereby increasing the mechanical stability of any material residues within the bevel region 103. In addition, the material residues may be removed, wherein the protection layer 107 may additionally include an etch stop component, such as a silicon carbide sub-layer, so as to substantially prevent any etch damage in the substrate 101 due to the enhanced etch resistance of silicon carbide with respect to a plurality of wet chemical etch recipes.

With respect to FIGS. 2*a*-2*c*, further illustrative embodiments will now be described, wherein, additionally or alternatively, the surface topography of the bevel region of the substrate is modified to exhibit an increased surface area, thereby improving the adhesion of any material deposited in the bevel region.

Figure 2A:
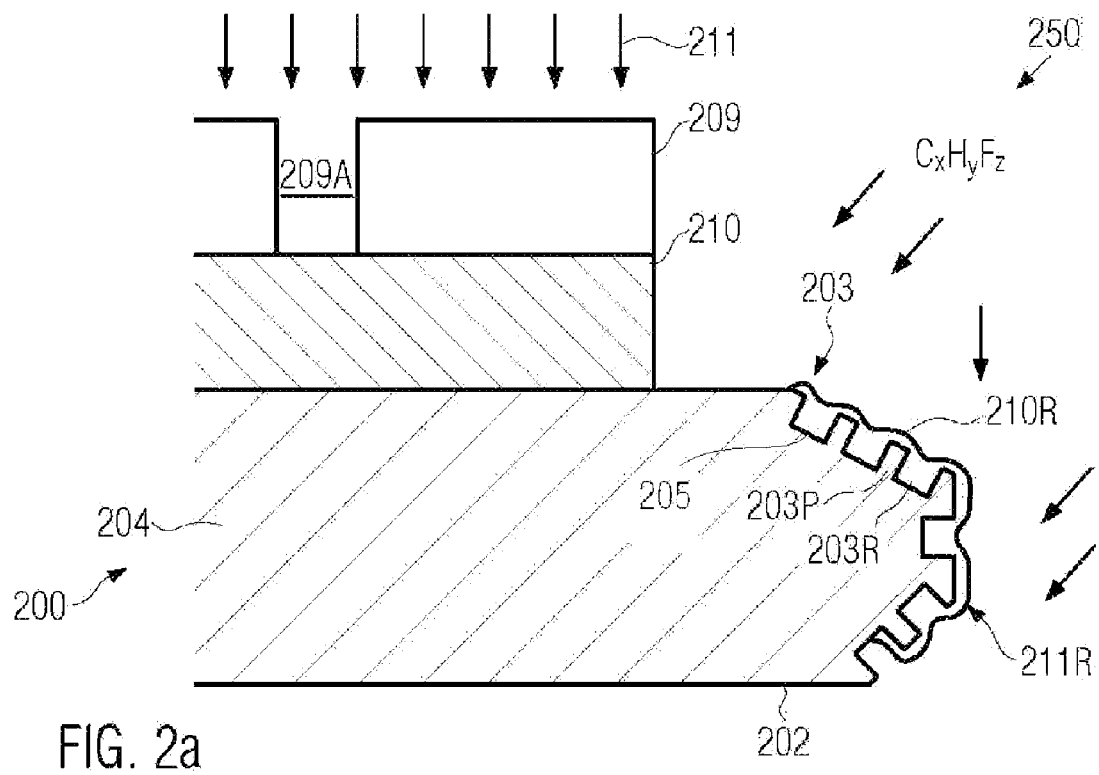
FIGS. 2a-2c schematically illustrate a cross-sectional view of a semiconductor device during the formation of a metallization layer wherein a bevel region has a modified surface topography.

FIG. 2*a* schematically illustrates a semiconductor device 250 including a substrate 200 having a central region 204 and a bevel region 203. Furthermore, a dielectric layer stack 210 may be formed in the central region 204, wherein certain material residues 210R may also be formed in the bevel region 203. Furthermore, a mask layer 209 having a respective opening 209A may be formed above the dielectric layer stack 210. With respect to the components of the semiconductor device 250, substantially the same criteria apply as previously explained with reference to the corresponding components of the device 150. Moreover, in the embodiment shown, the bevel region 203 may have a modified surface topography wherein, for instance, one or more recesses 203R may be provided so as to significantly increase the overall surface area of the bevel region 203. It should be appreciated that the recesses 203R may per se also define respective protrusions 203P. In some illustrative embodiments, the one or more recesses 203R may be provided in the form of groove-like recesses that may extend over significant portions and in some embodiments may circumferentially extend around the entire substrate 200.

The semiconductor device 250 as shown in FIG. 2*a* may be formed on the basis of the following processes. In some illustrative embodiments, the substrates 200 may be processed to receive the one or more recesses 203R in an early manufacturing stage, for instance prior to the formation of any circuit elements within the central region 204. For example, respective grooves or trenches may be ground or cut into respective portions of the bevel region 203. For example, respective process tools for forming the bevel 205 in the bevel region 203 are well established in the art and similar tools may also be used for manufacturing the respective recesses 203R. In other cases, the respective modified surface topography of the bevel region 203 may be formed in a later stage, depending on the process requirements. Thereafter, any circuit elements, as well as the dielectric layer stack 210 and the mask layer 209, may be formed on the basis of process techniques as previously described with reference to the semiconductor device 150. Thereafter, an anisotropic etch process 211 may be performed in order to transfer the opening 209A into the dielectric layer stack 210, wherein corresponding polymer materials may be deposited in the bevel region 203 having the increased surface topography, for instance based on the recesses 203R. Thus, respective polymer residues 211R may form in the bevel region 203, wherein, however, contrary to conventional techniques, an increased adhesion may be obtained due to the increased surface area and the complex surface topography. After the completion of the etch process 211, a corresponding spatially selective etch process may be performed to remove at least a portion of the polymer residues 211R. Next, a metal-containing material may be deposited, as is also described with reference to the device 150.

Figure 2B:
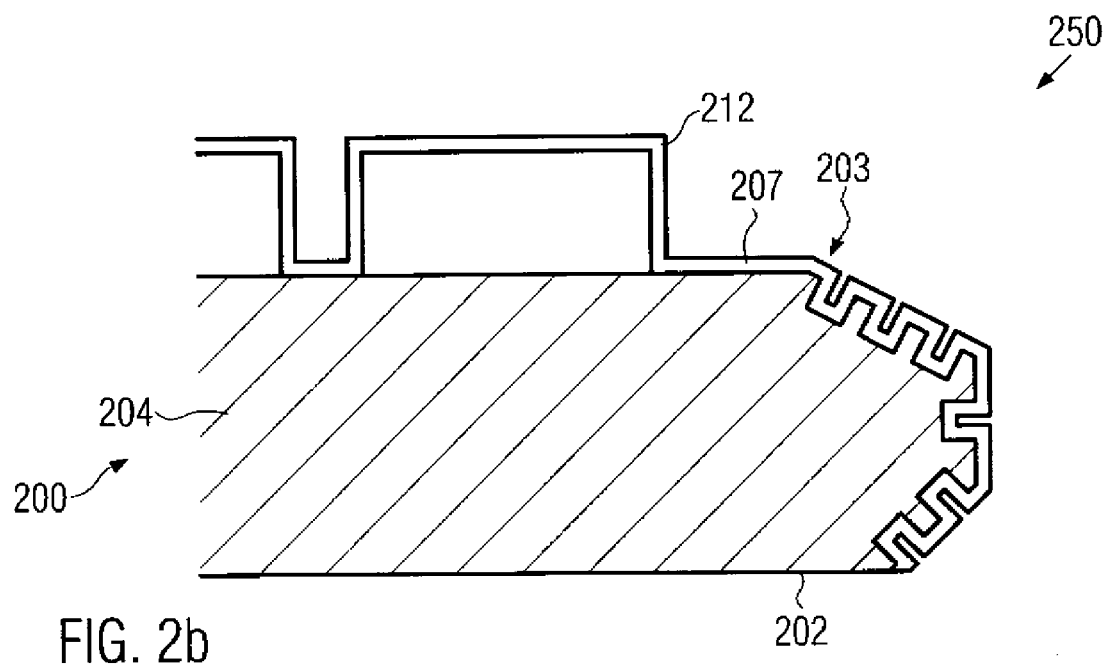

FIG. 2b schematically illustrates the semiconductor device 250 after the deposition of a respective metal-containing layer 212, which may act as a barrier and/or seed layer for a subsequent process step. As previously explained, the material layer 212 may also be deposited in the bevel region 203, wherein the reduced polymer residues 211R may be covered by the material of the layer 212. Contrary to the conventional regime, however, the respective polymer residues 211R may be efficiently "embedded" into the material of the layer 212, which may nevertheless exhibit a moderately high adhesion to the bevel region 203 due to the increased available surface area and the complex surface topography. Consequently, the semiconductor device 250 as shown in FIG. 2b may have a significantly reduced probability for causing flaking events in subsequent process steps. Thereafter, the process may be continued by depositing a bulk metal, such as copper, copper alloy and the like, and by removing any excess material to provide a metal region within the opening 210A of the dielectric layer stack 210.

Figure 2C:
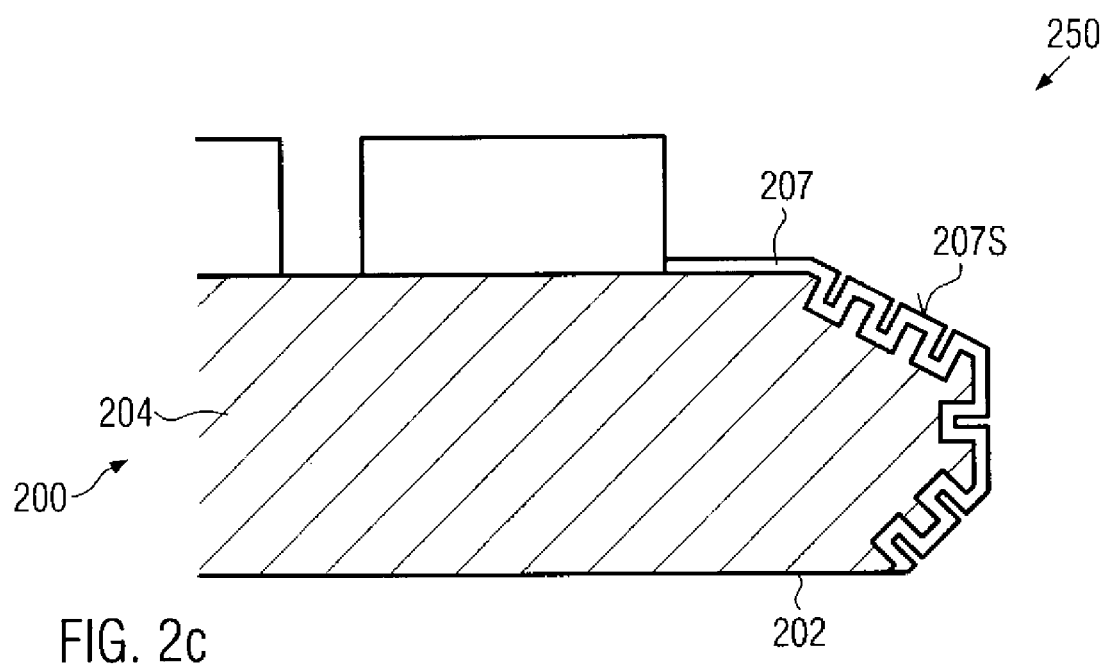

FIG. 2c schematically illustrates the semiconductor device 250 according to yet another illustrative embodiment, in which the modified surface topography, for instance provided by the recesses 203R, may be combined with the provision of a protection layer 207, which may have substantially the same characteristics as the layer 107 previously described. Thus, the protection layer 207, comprising at least a surface portion 207S having a reduced adhesion capability with respect to etch-related polymer materials compared to the bevel region 203 without the protection layer 207, additionally provides a significantly reduced amount of polymer residues 211R during the etch process 211. Moreover, the protection layer 207 may itself have a higher adhesion to the bevel region 203 due to the increased surface area, thereby even further reducing the risk of material delamination in subsequent process steps. Consequently, during the further processing, any additionally deposited material may encounter a reduced amount of polymer residues 211R in combination with an overall enhanced degree of adhesion, since any further material may "engage" with the bevel region 203 via the protection layer 207, which now exhibits a significantly enhanced adhesion strength.

In other embodiments, the increased surface of the bevel region 203 may be obtained on the basis of spatially restricted etch processes, such as supplying an appropriate etchant selectively to the bevel region in a highly non-uniform manner, for instance by using the tool 120, previously described, in order to obtain a certain amount of "pitting" into the surface of the bevel region, thereby significantly increasing the surface area.

As a result, the subject matter disclosed herein provides an efficient technique for reducing the risk of material delamination and thus device and tool contamination during the formation of complex metallization structures, which, in some illustrative embodiments, comprise a low-k dielectric material. In one aspect, the deposition of polymer materials during an anisotropic etch process for patterning the dielectric layer stack of a metallization layer may be significantly reduced by modifying the surface characteristics of the bevel region to exhibit a significantly reduced degree of adhesion with respect to the polymer materials. This may be accomplished on the basis of an appropriately designed protection layer that is selectively formed in the bevel region in order to provide a reduced number of chemical bonds to which the respective polymer materials may connect. Due to the reduced accumulation rate of polymer material in the bevel region, a corresponding wet chemical or dry chemical cleaning process for removing polymer residues may be omitted or may at least be performed with significantly relaxed process constraints. In another aspect, the surface topography of the bevel region may be modified to exhibit a significantly enlarged surface area in order to enhance the adhesion of any materials deposited during the formation of a metallization structure, thereby efficiently compensating for, or at least reducing the effect of, any polymer material that may have been deposited on the modified surface topography. The efficiency of the modified surface topography may be significantly enhanced by additionally providing a protection layer having a high capability of rejecting polymer materials during the corresponding patterning process for forming the metallization structure.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:
1. A method, comprising:
forming a protection layer above a portion of a surface of a bevel region of a substrate having a central region adjacent to said bevel region for receiving circuit elements therein;
removing said protection layer from said central region to substantially exclude said protection layer from the central region;
forming a dielectric layer stack for a metallization layer above said substrate; and
patterning said dielectric layer stack by an anisotropic etch process.

2. The method of claim 1, wherein forming said protection layer comprises spin coating a material of said protection layer onto said bevel region and curing said material to form said protection layer.

3. The method of claim 1, wherein said protection layer comprises a polyimide material having a surface exhibiting a different adhesion characteristic with respect to etch-related polymer materials compared to said surface area of said bevel region.

4. The method of claim 1, further comprising forming a surface topography in said surface of the bevel region prior to forming said protection layer for increasing an interface between said protection layer and said surface of the bevel region.

5. The method of claim 4, wherein forming said surface topography comprises forming one or more recesses in said bevel region.

6. The method of claim 5, wherein forming said one or more recesses comprises forming a plurality of grooves in said bevel region.

7. The method of claim 1, wherein forming said protection layer comprises depositing said protection layer above said central region and said bevel region, and subsequently removing said protection layer to substantially exclude said protection layer from said central region.

8. The method of claim 7, wherein forming said protection layer further comprises forming a mask layer above said central region, depositing said protection layer above said mask layer and in said bevel region and removing said mask layer commonly with said protection layer from said central region.

9. The method of claim 7, wherein forming said protection layer comprises forming a mask layer above said protection layer, etching said mask layer to expose said protection layer in said central region, while maintaining a portion of said mask layer in said bevel region.

10. The method of claim 9, further comprising removing an exposed portion of said protection layer and said portion of said mask layer in a common etch process so as to maintain at least a portion of said protection layer in said bevel region.

11. A method, comprising:
    forming a dielectric layer stack for a metallization layer of a semiconductor device above a substrate, said substrate having a central region adjacent to a bevel region, said bevel region having a surface topography including recesses for increasing a surface area;
    selectively forming one or more recesses in said bevel region by an etch process that is spatially restricted to substantially said bevel region to provide said surface topography; and
    patterning said dielectric layer stack by an anisotropic etch process.

12. The method of claim 11, further comprising depositing a metal-containing material on said patterned dielectric layer stack.

13. The method of claim 11, further comprising selectively changing an adhesion characteristic in at least a portion of said bevel region having the increased surface area with respect to a polymer species used when patterning said dielectric layer stack.

14. The method of claim 13, wherein selectively changing an adhesion characteristic comprises selectively forming a protection layer having an affinity for fluorine-containing polymer materials that is reduced compared to an affinity of said bevel region of the substrate for said fluorine-containing polymer materials.

15. The method of claim 14, wherein forming said protection layer comprises forming a mask layer in said central region, depositing said protection layer above said mask layer and said bevel region and removing said mask layer and a portion of said protection layer from said central region.

16. The method of claim 14, wherein forming said one or more recesses comprises forming one or more grooves.

17. A method, comprising:
    forming a protection layer above a bevel region of a substrate that is adjacent a central region of the substrate; said bevel region having a plurality of recesses;
    removing said protection layer from said central region to substantially exclude said protection layer from the central region, and
    after forming said protection layer and removing said protection layer from said central region, patterning a dielectric layer stack formed in a central region of said substrate, said central region comprising a plurality of circuit elements of an integrated circuit.

* * * * *